(12) United States Patent
Nakajima

(10) Patent No.: US 6,414,298 B1
(45) Date of Patent: Jul. 2, 2002

(54) REDUCED SMEARING OPTRONIC TRANSCEIVER

(75) Inventor: Hisao Nakajima, Bagneux (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/556,778

(22) Filed: Apr. 25, 2000

(30) Foreign Application Priority Data

Apr. 28, 1999 (FR) .............................................. 99 05363

(51) Int. Cl.⁷ ................................................ H01J 40/14
(52) U.S. Cl. ............................ 250/214 R; 250/214 AL; 250/214 B; 250/214 C
(58) Field of Search ......................... 250/214 R, 214.1, 250/216, 227.11, 227.24, 214 AL, 214 B, 214 C; 257/78, 80, 82, 84, 290; 372/50, 43

(56) References Cited

U.S. PATENT DOCUMENTS 5,712,864 A    1/1998  Goldstein et al.
5,929,444 A  * 7/1999  Leichner .................. 250/341.7

FOREIGN PATENT DOCUMENTS

| EP | 0 755 082 | 1/1997 |
| EP | 0 795 910 | 9/1997 |
| EP | 0 847 113 | 6/1998 |
| JP | 02001015775 A | * 1/2001 | ....... H01L/31/0232 |

OTHER PUBLICATIONS

Koch et al., "Semiconductor Photonic Integrated Circuits," IEEE Journal of Quantum Electronics, vol. 27, No. 3 Mar. 1991.*

T.L. Koch, et al., IEEE Journal of Quantum Electronics, vol. 27, No. 3, pp. 641–653, "Semiconductor Photonic Integrated Circuits," Mar. 1991.

H. Nakajima, et al., IEEE Photonics Technology Letters, vol. 8, No. 11, pp. 1561–1563, "Full–Duplex Performance Assessment of In–Line Transceivers Emitting at 1.3μm and Receiving at 1.55 μm," Nov. 1996.

W. Metzger, et al., 20$^{th}$ European Conference on Optical Communication, vol. 4, pp. 87–90, "Photonic Integrated Transceiver for the Access Network," Sep. 25–29, 1994.

* cited by examiner

Primary Examiner—Robert H. Kim
Assistant Examiner—Courtney Thomas
(74) Attorney, Agent, or Firm—Oblon, Spivak, McClelland, Maier & Neustadt, P.C.

(57) ABSTRACT

In a semiconductor device (1) for the transmission-reception of modulated optical signals having a semiconductor substrate on which are monolithically integrated a transmitter (4) able to transmit a signal formed by a modulated light carried by a first wavelength, a receiver (6) able to detect a reception signal formed by a modulated light carried by a second wavelength is also provided a sensor (10) of a signal representative of extraneous noise and subtraction means (11, 13, 15) for subtracting from the reception signal a compensation signal formed from the signal representing the extraneous noise detected by the sensor (10). The invention also relates to a process in which the extraneous noise is detected in the vicinity of the receiver and from the signal received by the receiver is subtracted a signal formed from the detected extraneous noise signal.

10 Claims, 2 Drawing Sheets

REDUCED SMEARING OPTRONIC TRANSCEIVER

TECHNICAL FIELD

The present invention relates to a semiconductor device for the transmission-reception of modulated optical signals on which are monolithically integrated a transmitter and an optical receiver, as well as means for reducing smearing between the transmitter and the receiver.

PRIOR ART

It is currently accepted that bidirectional communications will be provided by integrated optronic circuits having on the same circuit a transmitter e.g. transmitting on a wavelength of 1.3 μm and a receiver receiving on a wavelength of 1.55 μm or conversely transmitting on a wavelength of 1.55 μm and receiving on a wavelength of 1.3 μm. One point relative to the hopes and difficulties of implementing such circuits forms the object of an article in the "Journal of Quantum Electronics", according to reference [1] in the list of references attached to the present application.

One of the difficulties is due to smearing problems between the transmitter and receiver of the integrated circuit.

Although the transmission laser operates at a wavelength of e.g. 1.3 μm and the reception photodiode is optimized in order to have a maximum sensitivity at a wavelength of 1.55 μm, the photodiode is also sensitive to the wavelength of 1.3 μm, transmitted in the vicinity by the laser with a power able to reach several hundred times the saturation level of the photodiode. This leads to the well known smearing problem.

Thus, European patent application EP 732 782 [2] describes an in-line integrated optronic circuit in which an absorbent of the wavelength transmitted by the laser is placed between the transmitter and the reception photodiode. This leads to a receiver with an improved signal-to-noise ratio.

Improvements to this manner of reducing smearing are described in European patent application EP 755 082 [3].

Several absorbing units are placed between the transmitter and the receiver. The increase in the number of absorbing units makes it possible to obtain an acceptable smearing of the order of −40 dB without any excessive increase in the length of the device. This solution is more efficient than that consisting of increasing the length of a single unit.

Patent application EP 795 910 [4] also describes an integrated optronic circuit having means for reducing between the transmitter and the receiver, in which the means for reducing smearing comprise an electro-absorbent placed between the transmitter and the receiver. The electro-absorbent has a forbidden band width between the forbidden band width of a laser material constituting an active layer of the transmitter and the forbidden band width of a laser material constituting an active layer of the receiver. These absorbing means can be completed by a supplementary electro-absorbing layer able to absorb the transmitter light.

The means described up to now are passive means with which the aim is to reduce the noise produced in the reception photodiode by the laser transmitter located in the vicinity thereof.

Attempts have also been made to reduce the noise caused by the transmitter in the receiver in an active manner. Thus, in an article [5] entitled "Full Duplex Performance Assessment of In Line Transceivers Emitting at 1.3 μm and Receiving at 1.55 μm/s", the authors explain how they actively reduced smearing.

They used a structure having three units comprising a DFB transmission laser with a distributed reflector at 1.3 μm, a Fabry Perot resonator laser replacing the reception photodiode at 1.55 μm and an absorption unit at 1.3 μm placed between the two laser units.

Experiments were carried out with the aim of evaluating the improvement which could be obtained by reducing the modulation coefficient m' representing the modulation of the signal transmitted at 1.3 μm as received at the receiver at 1.55 μm.

Two methods were used.

In a first method, there is a simultaneous modulation of the signal transmitted by a data signal and the absorption unit by a signal complimentary of the data signal obtained by a phase shift of 180° of the data signal.

According to the second method, the data signal is sent following attenuation and phase adjustment to an input of a differential amplifier receiving on a second input the signal detected by the reception photodiode at 1.55 μm. Thus, the resulting signal at the output of the differential amplifier is a differential signal between the signal and the noise received by the photodiode and the data modulation signal of the transmitter at 1.3 μm.

As a result of these procedures, it was possible to obtain a sensitivity of −23.9 dBm and −19.1 dBm for transmission rates of 68 Mb/S and 196 Mb/S respectively, in complete duplex communication.

These figures are close to those obtained when the laser at 1.3 μm has not been modulated. As far as is known to the inventor the best results obtained on the publication date of document [5] with an integrated optronic circuit were obtained with an in-line transceiver circuit having an intermediate absorption unit. More recently with a new structure permitting the absorption of unguided light, for a modulated optical power of 2 mW peak-to-peak in transmission, a sensitivity above −31 dBm was measured for a complete duplex communication at 155 Mb. The disadvantage due to the complete duplex is evaluated as 1 dB. However, leaks of the transmission laser are always present and it has not been possible to obtain a similar sensitivity with a stronger modulation of the laser. At present, there is considered to be no way of avoiding extraneous leaks towards the reception photodiode due to the geometrical limitations resulting from the sought ever-reduced dimensions of the monolithically integrated optronic circuit.

BRIEF DESCRIPTION OF THE INVENTION

The idea on which the invention is based is to actively reduce noise due to extraneous light of the transmitter by placing an extraneous light sensor in the vicinity of the detection photodiode. Thus, e.g. using a differential amplifier, the signal from the transducer is subtracted from the signal detected by the photodiode. In summarizing, the invention relates to a process for improving the detection sensitivity of a signal received by a receiver of an integrated optronic circuit, which is characterized in that the extraneous noise is detected in the vicinity of the receiver and from the signal received by the receiver is subtracted a compensation signal formed from the detected extraneous noise signal.

This process is implemented by a semiconductor device for the transmission-reception of modulated optical signals implemented on a semiconductor substrate, on which are monolithically integrated a first semiconductor component having a first active layer, said first component being a transmitter able to transmit a transmitted signal formed by a modulated light carried by a first wavelength, a second semiconductor component having a second active layer, said second component being a receiver able to detect a reception signal formed by a modulated light carried by a second wavelength, characterized in that said device also includes a sensor of a signal representing an extraneous noise and subtraction means for subtracting from the reception signal a compensation signal formed from the signal representing the extraneous noise detected by said sensor.

Thus, as a result of said device, by adjusting the phase and amplitude of the signal detected by the sensor of the monolithic circuit adjusted to the transmission wavelength, it is possible to compensate the leaks of the transmission signal and there is a significant improvement to the signal-to-noise ratio of the receiver.

The monolithic device can be an in-line device, as is e.g. described in patent application EP 755 082 A1 [3], or a surface component as is e.g. described in the article by METZGER et al published in the records of the 20th European conference on optical communications ECOC 94 held in Florence, Italy, pp 87–90 and entitled "Photonic integrated transceiver for access network" [6].

Preferably, the sensor of the extraneous signal and the receiver are similar semiconductor structures in order to have the same wavelength fluctuations with the temperature variations.

BRIEF DESCRIPTION OF THE DRAWINGS

The invention will be better understood and differentiated from the prior art by the following description of embodiments of the invention with reference to the attached drawings, wherein show.

DESCRIPTION OF EMBODIMENTS

Figure 1:
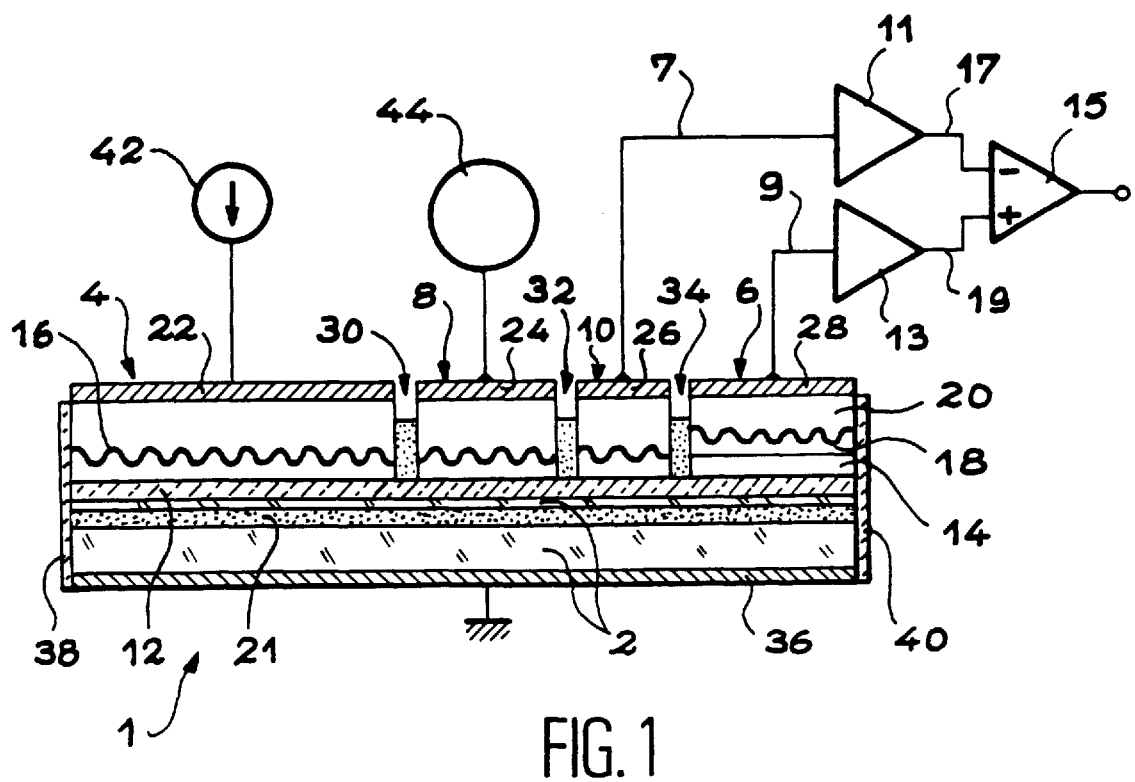
FIG. 1 A circuit diagram of an in-line optronic circuit in accordance with the present invention.

The device 1 according to the invention diagrammatically shown in FIG. 1 comprises in-line on a semiconductor substrate 2, a laser transmission unit 4, an absorption unit 8 for absorbing the light transmitted rearwards by the laser transmission section 4 and a sensor 10 for detecting the extraneous light in the vicinity of a final unit 6. Said unit 6 is an integrated photodiode receiving modulated light at the wavelength 1.55 µm. The signal supplied by the sensor 10 is sent to an input 7 of an amplifier 11. The output 17 of said amplifier constitutes a first input for a differential amplifier 15. The signal detected by the receiver 6 is sent to an input 9 of an amplifier 13. The output 19 of said amplifier constitutes a second input for the differential amplifier 15.

More specifically, the device of FIG. 1 comprises on the substrate 2, e.g. N-doped InP, a first active layer 12 at the wavelength of 1.3 µm, which is common to the units 4, 8, 10 and 6, and a second active layer 14 at the wavelength of 1.55 µm, which extends into the unit 6, e.g. above the layer 12, as can be seen in FIG. 1. A Bragg grating 16, whose Bragg wavelength is 1.3 µm, extends over the active layer 12. This grating is also present for design simplification reasons above the layer 12 of units 8 and 10 and optionally above the layer 14 of unit 6. In the case where component 1 is also used as a transmitter at 1.55 µm, it is of interest to provide a Bragg grating 18 at 1.55 µm above the layer 14.

These gratings 16 and optionally 18 are covered by a confinement layer 20, e.g. of P-doped InP. Said confinement layer 20 is covered by conductive layers 22, 24, 26 and 28 respectively at units 4, 8, 10 and 6. An absorption layer 21 is inserted between the waveguide formed by the active layer 12 and the substrate 2. Said layer 21 is separated from the layer 12 by a separation layer of the same composition as layer 2 and which for this reason also carries the reference 2. Zones 30, 32, 34 are etched from the upper face of the device through said conductive layers and into the layer 20 in order to ensure the mutual electrical insulation of layers 22, 24, 26 and 28, as can be seen in FIG. 1. The lower face of the device, i.e. the lower face of the substrate 2, is covered with a conductive layer 36 for earthing or grounding. Thus, in this embodiment, the semiconductor structures of units 8 and 10 are similar. Thus, the units will have the same behaviour with the temperature changes. The front face of the device, i.e. that located on the side of the unit 4 is covered with an antireflecting coating 38. The rear face of the device, i.e. that located on the side of the layer 4, is covered with a high reflectivity coating 40. It is pointed out that the coatings 38 and 40 are not obligatory. Polarization means 42, 44 are provided for polarizing the conductive layers 22 and 28 respectively.

Operation is as follows. The laser unit 4 is polarized and modulated by a data signal $I_b$ applied to the polarization means 42. The absorption unit 8 is inversely polarized so as to obtain a maximum absorption of the light from the laser at 1.3 µm and directed rearwards. The light from the laser comprises guided light and unguided light and contains both stimulated light and light resulting from spontaneous transmission. This means that the light detected by the absorption unit 8 arrives through active layer 12 but also from elsewhere. This light does not only contain stimulated light coming directly from the layer 12, but also extraneous lights transmitted by the layer 12 at other wavelengths, because spontaneous transmission has a wide spectral band. Thus, said lights have optical spectra and modulation responses of different natures compared with what is to be filtered and transmitted. Thus, the absorption unit 8 will have an unequal absorption efficiency for different wavelengths of the spectrum. The absorption efficiency can be reduced for unguided, spontaneous and stimulated light and for spontaneous guided light. The ineffectiveness of the absorption unit for unguided light is due to the fact that said absorption unit 8 is not traversed by said unguided light and consequently has no action thereon. The ineffectiveness of the absorption unit for the spontaneous guided light is due to the fact that the absorbent cannot be optimized for absorbing the complete spontaneous transmission spectrum. Despite the demonstrated efficiency of the absorption layer 21 in preventing unguided light propagation towards and reflected by the substrate layer 2, said procedure is unable to prevent the lateral propagation of light. This is why, despite the presence of these passive elements for preventing the pollution of the receiver by the transmitter, a residual pollution persists.

The idea on which the invention is based is to detect in the vicinity of the unit forming the receiver component 6 a signal which, in the band of the receiver, represents the light leak due to the unit forming the transmitter component 4. This function is devolved to the sensor 10 for detecting the intensity and phase of the leakage light. This signal representing the leakage light received by the receiver 6 and amplified by the amplifier 11 is subtracted from the reception signal by means of the differential amplifier 15. Thus, by adjusting the amplification level of the amplifier 11 of the leakage signal, it is possible to compensate the influence of said signal in the reception signal.

With the exception of the additional reception layer 14 at 1.55 µm, it should be noted that the structure of the sensor 10 is the same as that of the receiver 6. The sensor 10 and receiver 6 are as close as possible to one another, the sensor being immediately adjacent to the receiver. Thus, the extraneous signal detected by the layer 12 of unit 10 is still close to that detected by the reception layer 14 in receiver 6.

Figure 2:
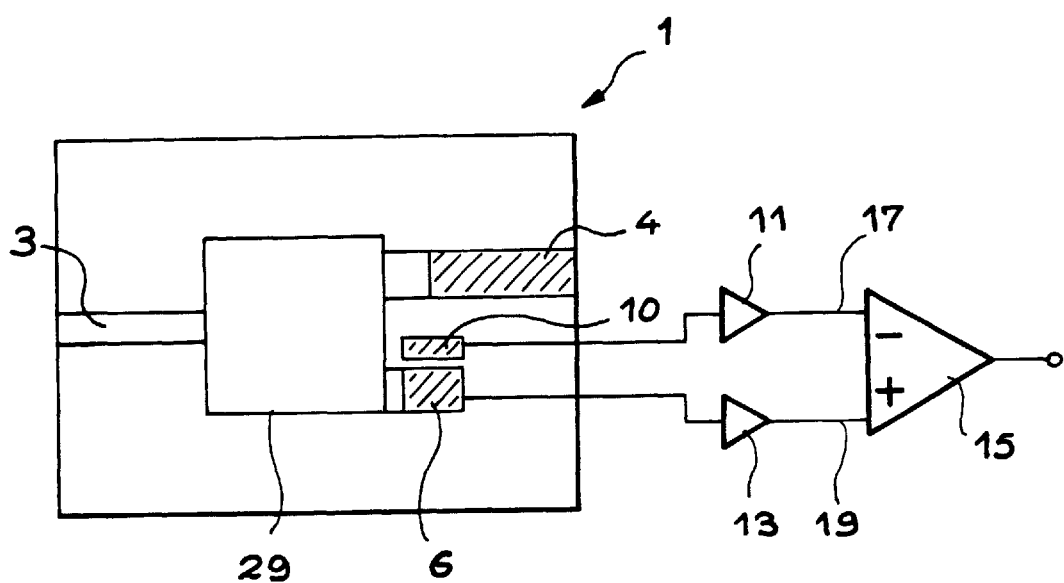
FIG. 2 A circuit diagram of a surface optronic circuit according to the invention.

Another embodiment where the different components of the optronic circuit are implemented on the surface and no longer in-line is diagrammatically shown in FIG. 2. In FIG. 2 the elements having the same function as those in FIG. 1 carry the same reference numeral. The lights from the transmission and reception circuits are separated from one another in per se known manner by means of a wavelength separation filter 29 (WDM). The lights are received and transmitted by a waveguide 3. It is important to note that the sensor 10 is located as close as possible to the receiver 6, the sensor having a side immediately adjacent to the side of the receiver, so as to receive an extraneous signal as close as possible to the extraneous signal effectively received by the receiver 6. Surface optronic circuits are in themselves known and for further details concerning their construction reference can e.g. be made to the aforementioned article by Metzger et al [6].

Figure 3:
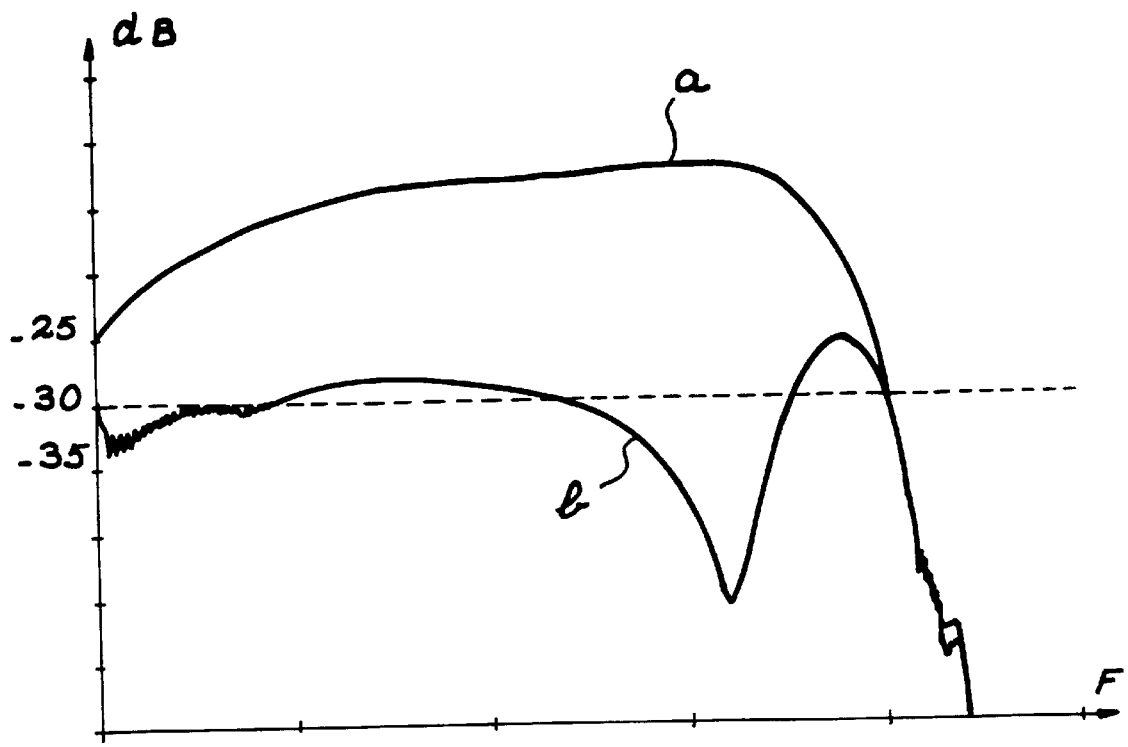
FIG. 3 Two smearing value curves as a function of the modulation frequency, one without and one with the sensor according to the invention.
Figure 4:
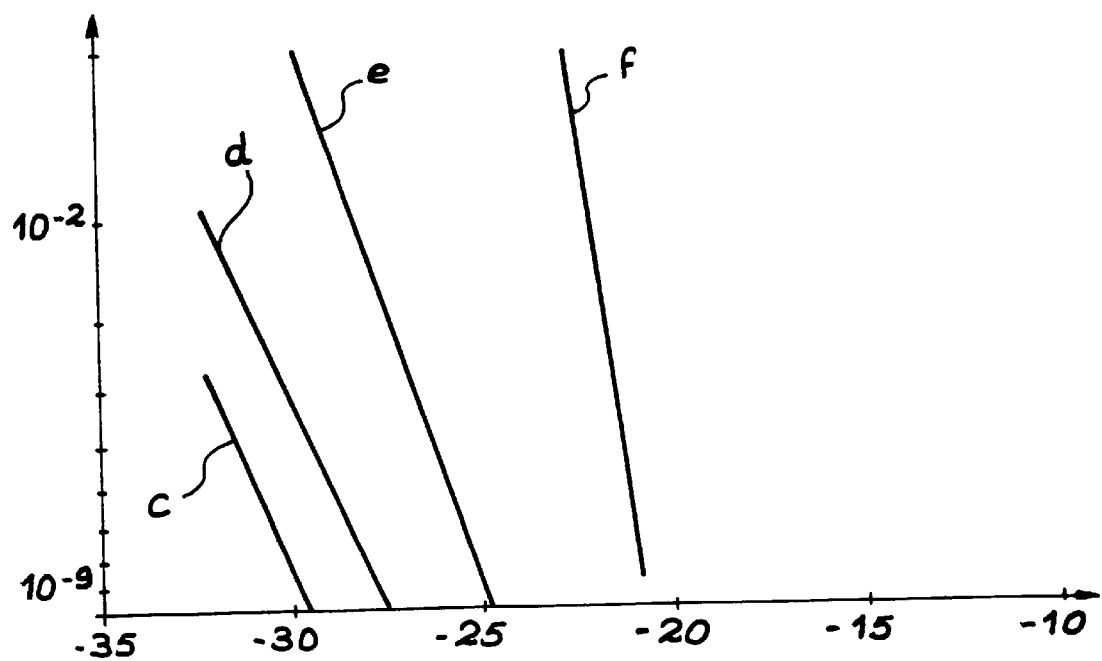
FIG. 4 Curves representing the on-bit error rate logarithm as a function of the mean power received by the receiver.

Results obtained with a circuit like that shown in FIG. 1, but for a component transmitting at 1.55 µm and receiving at 1.3 µm, are illustrated by the curves in FIGS. 3 and 4. In FIG. 3 curves a and b represent on the useful band width the smearing level as a function of the frequency. Curve a represents said smearing level without subtraction of the extraneous signal. Curve b represents the smearing level with subtraction of the extraneous signal by means of the sensor 10 and differential amplifier 15. It can be seen that the smearing level is improved on average by 15 decibels over the entire band.

FIG. 4 shows the error rates expressed by the logarithm of the ratio between the mean number of errors and the number of bits transmitted, as a function of the mean power of the signal received by the receiver 6, expressed in decibels. Curves c and d represent the error rate when the transmitter 4 is not polarized (polarization current=0 mA) and when the transmitter is polarized by a current of 40 mA respectively. Curves e and f represent said same error rate when the communication is a total duplex communication taking place with an average rate of 68 megabits per second in both directions. Curve e shows the situation with subtraction of the extraneous signal detected by the sensor 10 and curve f the situation without subtraction of the same signal. The curves of FIG. 4 show that the reception is effectively disturbed by the starting up of the transmitter, despite the passive precautions taken. They also show that the reception sensitivity is significantly improved by using the device according to the invention.

APPENDIX: LIST OF REFERENCES

[1] T. L. Koch and U. Koren, "Semiconductor photonic integrated circuit", IEEE J. Quantum Electronic., QE 27, pp 641–653, 1991
[2] L. Goldstein, J. L. Gentner, F. Brillouet "Optical duplex device" FR 9503057, EP 732782
[3] EP patent application 755 082, H. Nakajima and J. Charil, "Semiconductor transceiver, particularly at 1.3 µm and 1.55 µm", French patent 95 08611, filed on Jul. 17, 1995
[4] EP patent application 795 910 H. Nakajima and J. Charil, "Low smearing semiconductor transceiver", French patent 96 03080, filed Mar. 12, 1996
[5] H. Nakajima, A. Leroy and J. Charil "Full duplex performance assessment of in line transceivers emitting at 1.3 µm and receiving at 1.55 µm/s", published in IEEE Photonics Technology Letters, vol. 8, No. 11, November 1996, pp 1561–1563
[6] METZGER et al, records of the 20th European conference on optical communications ECOC 94 held in Florence, Italy, pp 87–90 entitled "Photonic integrated transceiver for the access network"

What is claimed is:

1. Semiconductor device (1) for the transmission and reception of modulated optical signals implemented on a semiconductor substrate (2), on which are monolithically integrated a first semiconductor component (4) having a first active layer (12), said first component being a transmitter (4) able to transmit a transmitted signal formed by a modulated light carried by a first wavelength, a second semiconductor component (6) having a second active layer (14), said second component (6) being a receiver (6) able to detect a reception signal formed by a modulated light carried by a second wavelength, characterized in that the device also comprises a sensor (10) of a signal representing an extraneous noise and subtraction means (11, 13, 15) for subtracting from the reception signal a compensation signal formed from the signal representing the extraneous noise detected by said sensor (10).

2. Device for the transmission and reception of optical signals according to claim 1, characterized in that the receiver (6) and sensor (10) are arranged in-line, the sensor (10) being immediately adjacent to the receiver (6).

3. Device for the transmission and reception of optical signals according to claim 2, characterized in that absorption means (8) are placed between the transmitter (4) and the sensor (10).

4. Device for the transmission and reception of optical signals according to claim 1, characterized in that the receiver (6) and sensor (10) are placed on the surface, the sensor (10) having a side immediately adjacent to a side of the receiver (6).

5. Device for the transmission and reception of optical signals according to one of the claims 1 to 4, characterized in that the semiconductor structures (36, 2, 21, 12, 20) of the sensor (10) and receiver (6) are similar.

6. Process for improving the detection sensitivity of a signal received by a receiver of an integrated optronic circuit, characterized in that the extraneous noise is detected in the vicinity of the receiver and from the signal received by the receiver is subtracted a compensation signal formed from the detected extraneous noise signal.

7. Device for the transmission and reception of optical signals according to claim 1, wherein said first component produces said extraneous noise in a form of light having at least one wavelength different than said first wavelength.

8. A semiconductor device configured to transmit optical signals at a first wavelength and receive optical signals at a second wavelength, the semiconductor device comprising:

a semiconductor substrate;

a transmitter integrated on said semiconductor substrate and configured to transmit said optical signals at a first wavelength;

a receiver integrated on said semiconductor substrate and configured to receive optical said signals at a second wavelength;

a sensor integrated on said semiconductor substrate and configured to sense extraneous light from said transmitter component; and a differential amplifier configured to subtract a compensation signal corresponding to said extraneous light from a reception signal received by the receiver component.

9. The semiconductor device according to claim 8, wherein the sensor is configured on said semiconductor substrate closer to the receiver than to the transmitter component.

10. The semiconductor device according to claim 8, wherein the extraneous light is a form of light having at least one wavelength different than said first wavelength.

* * * * *